United States Patent [19]

Schweizer et al.

[11] 4,222,794
[45] Sep. 16, 1980

[54] SINGLE CRYSTAL NICKEL SUPERALLOY

[75] Inventors: Frederick A. Schweizer, East Hartford; David N. Duhl, Newington, both of Conn.

[73] Assignee: United Technologies Corporation, Hartford, Conn.

[21] Appl. No.: 54,086

[22] Filed: Jul. 2, 1979

[51] Int. Cl.² .............................................. C22F 1/10
[52] U.S. Cl. ..................................... 148/3; 75/171; 148/32.5; 148/162
[58] Field of Search ........................ 148/3, 32.5, 162; 75/171

[56] References Cited

U.S. PATENT DOCUMENTS 4,116,723  9/1978  Gell et al. ............................. 148/3

Primary Examiner—R. Dean
Attorney, Agent, or Firm—Charles E. Sohl

[57] ABSTRACT

A specific composition range and process sequence are described for the production of single crystal superalloy articles which have an exceptional combination of high temperature mechanical properties and resistance to oxidation and hot corrosion. The nominal composition is 5.2% Cr, 5.4% Al, 1.1% Ti, 2.0% Mo, 4.9% W, 6.4% Ta, 3% Re, 0.4% V, balance nickel. Material of this composition is cast and solidified in single crystal form and heat treated to produce an optimum microstructure.

2 Claims, 1 Drawing Figure

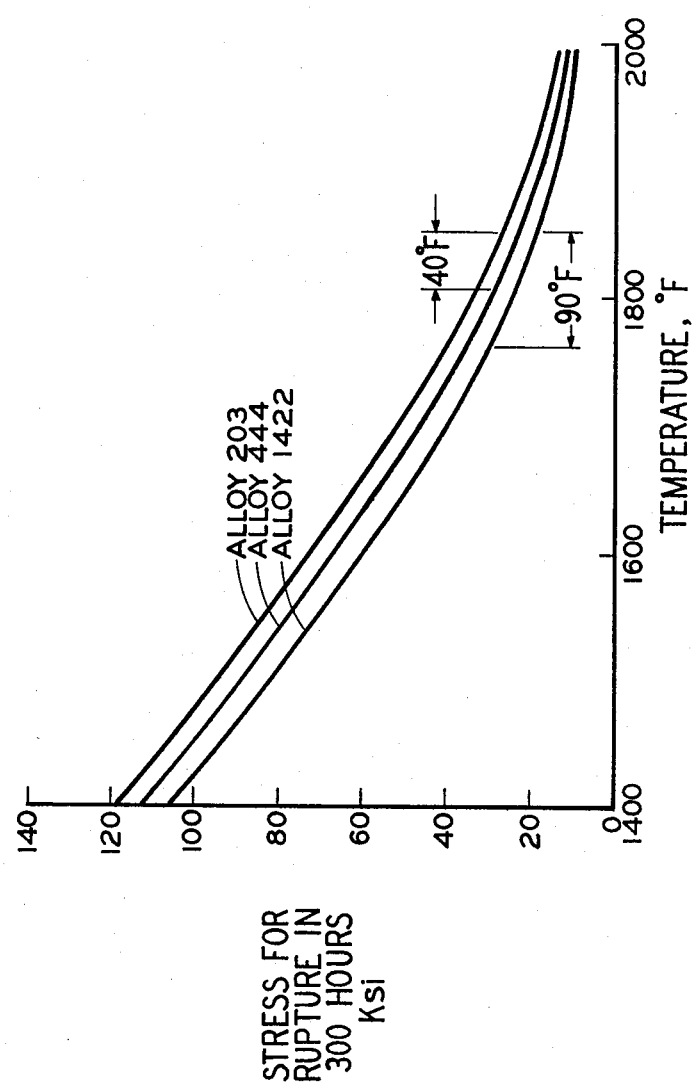

SINGLE CRYSTAL NICKEL SUPERALLOY

BACKGROUND OF THE INVENTION

As used herein, all percentages are weight percentages unless otherwise noted.

1. Field of the Invention

This invention relates to the field of nickel base superalloys and superalloy articles for use at elevated temperatures. This invention also relates to the field of single crystal metallic articles. Further, this invention relates to the heat treatment of single crystal superalloy articles.

2. Description of the Prior Art

The nickel base superalloy art area has been extensively investigated for many years, and as a result there are very many issued patents in this area. These include, for example, U.S. Pat. Nos. 2,621,122; 2,781,264; 2,912,323; 2,994,605; 3,046,108; 3,166,412; 3,188,204; 3,287,110; 3,304,176; and 3,322,534.

The conventional nickel base superalloys which are used to fabricate gas turbine components have evolved over the last 30 years. Typically, these alloys contain chromium to levels of about 10% primarily for oxidation resistance, aluminum and titanium in combined levels of about 5% for the formation of the strengthening gamma prime phase and refractory metals such as tungsten, molybdenum, tantalum and columbium in levels of about 5% as solid solution strengtheners. Virtually all nickel base superalloys also contain cobalt in levels of about 10%, and carbon in levels of about 0.1% which acts as a grain boundary strengthener and forms carbides which strengthen the alloy. Boron and zirconium are also often added in small amounts as grain boundary strengtheners.

Most commonly, gas turbine blades are formed by casting and the casting process most often utilized produces parts having equiaxed nonoriented grains. It is well-known that the high temperature properties of metals are usually quite dependent upon grain boundary properties, consequently, efforts have been made to strengthen such boundaries (for example by the additions discussed previously), or to reduce or eliminate the grain boundaries transverse to the major stress axis of the part. One method of eliminating such transverse boundaries is directional solidification, described in U.S. Pat. No. 3,260,505. The effect of directional solidification is to produce an oriented microstructure of columnar grains whose major axis is parallel to the stress axis of the part and which has minimal or no grain boundaries perpendicular to the stress axis of the part. A further extension of this concept is the utilization of single crystal parts in gas turbine blades. This concept is described in U.S. Pat. No. 3,494,709. The obvious advantage of the single crystal blade is the complete absence of grain boundaries. In single crystals, therefore, grain boundaries are eliminated as potential weaknesses, hence, the mechanical properties of the single crystal are completely dependent upon the inherent mechanical properties of the material.

In the prior art alloy development, much effort was devoted to the solution of problems resulting from grain boundaries, through the addition of elements such as carbon, boron, and zirconium. Another problem which prior art alloy development sought to avoid was the development of deleterious phases after long term exposures at elevated temperatures (i.e. alloy instability).

U.S. Pat. No. 3,567,526 teaches that carbon can be completely removed from single crystal superalloy articles and that such removal improves fatigue properties.

In single crystal articles which are free from carbon, there are two important strengthening mechanisms. The most important strengthening mechanism is the intermetallic gamma prime phase, $Ni_3(Al, Ti)$. In modern nickel base superalloys, the gamma prime phase may occur in quantities as great as 60 volume percent. The second strengthening mechanism is the solid solution strengthening which is produced by the presence of the refractory metals such as tungsten and molybdenum in the nickel solid solution matrix. For a constant volume fraction of gamma prime, considerable variations in the strengthening effect of this volume fraction of gamma prime may be obtained by varying the size and morphology of the gamma prime precipitate particles. The gamma prime phase is characterized by having a solvus temperature above which the phase dissolves into the matrix. In many cast alloys, however, the gamma prime solvus temperature is in fact above the incipient melting temperature so that it is not possible to effectively solutionize the gamma prime phase. Solutionizing of the gamma prime is the only practical way in which the morphology of the gamma prime can be modified, hence for many commercial nickel base superalloys the gamma prime morphology is limited to the morphology which resulted from the original casting process. The other strengthening mechanism, solid solution strengthening, is most effective when the solid solution strengthening elements are uniformly distributed throughout the nickel solid solution matrix. Again this strengthening is reduced in effectiveness because of the nature of the casting process. Practical nickel base superalloys freeze over a wide temperature range. The freezing or solidification process involves the formation of high melting point dendrites followed by the subsequent freezing of the lower temperature melting interdendritic fluid. This solidification process leads to significant compositional inhomogenities throughout the microstructure. It is theoretically possible to homogenize such a microstructure by heating at elevated temperatures to permit diffusion to occur, however, in practical nickel base superalloys the maximum homogenization temperature, which is limited by the incipient melting temperature, is too low to permit significant homogenization in practical time intervals.

Finally, U.S. Pat. No. 3,887,363 describes a nickel superalloy composition suited for directional solidification which is characterized by the absence of carbon and the presence of rhenium and vanadium.

U.S. Pat. No. 4,116,723 relates to the heat treatment of single crystal articles having a composition such that there is a useful heat treatment range between the gamma prime solvus temperature and the incipient melting temperature and such solution heat treatment temperature is high enough to permit essentially complete homogenization within commercially feasible times. Following such a homogenization treatment, the alloys are cooled and then heated to an intermediate temperature for a controlled precipitation step. The broad composition range as listed in U.S. Pat. No. 4,116,723 encompass in part the composition ranges of the present invention, although the composition of the present invention produces properties which are substantially improved over any properties shown in U.S. Pat. No. 4,116,723.

SUMMARY OF THE INVENTION

This invention relates to superalloy articles suited for use at elevated temperatures and particularly suited for use as an element in a gas turbine engine. The composition of the article is restricted to a rather narrow range comprising the following: 4.5 to 6% Cr, 5.0 to 5.8% Al, 0.8 to 1.5% Ti, 1.7 to 2.3% Mo, 4 to 6%, W, 5.5 to 8% Ta, 1 to 5% Re, 0.2 to 0.6% V, 0 to 7% Co, balance nickel.

The composition of the present invention contains rhenium and optionally cobalt. These are both elements which simultaneously increase the incipient melting temperature and decrease the gamma prime solvus temperature thus making the homogenization treatment possible. The presence of vanadium has also been found essential to achieve optimum properties.

This composition is produced in single crystal form by known casting techniques and is then heat treated by homogenization at an elevated temperature followed by an ageing treatment at a lower temperature.

When processed as described in the present application, single crystal articles of the preceding composition have an exceptional combination of properties. The combination of these properties including mechanical strength at elevated temperatures and resistance to oxidation and hot corrosion at elevated temperatures has not been achieved by any other composition known heretofore.

The foregoing, and other objects, features and advantages of the present invention will become more apparent in the light of the following detailed description of the preferred embodiment thereof as discussed and illustrated in the accompanying drawings.

DESCRIPTION OF THE PREFERRED EMBODIMENT

The present invention relates to a specific article having an exceptional combination of properties which were not simultaneously obtainable in the prior art articles.

The article of the present invention has a restricted composition consisting of 4.5 to 6% Cr, 5.0 to 5.8% Al, 0.8 to 1.5% Ti, 1.7 to 2.3% Mo, 4 to 6% W, 5.5 to 8% Ta, 1 to 5% Re, 0.2 to 0.6% V, 0 to 7% Co, balance nickel. The grain boundary strengthening elements B and Zr, and carbon are expressly excluded and are present, if at all, only as impurities.

This composition is similar in some respects as shown in U.S. Pat. No. 4,116,723 with the following significant differences: rhenium is present in small though important amounts and vanadium is present, an element not suggested in this prior art patent. Cobalt is also optionally present, and cobalt was also specifically excluded from the prior art patent. Even disregarding these changes, the composition range is much narrower and more specific than that in U.S. Pat. No. 4,116,723. This narrow and specific composition has an unexcelled combination of properties.

This alloy composition has practical utility only in single crystal form. Formation of the alloy into a single crystal is a critical aspect of the invention, but the exact method and details of the single crystal formation are not important. Typical articles solidification techniques are described in U.S. Pat. No. 3,494,709 to Piearcey which is assigned to the assignee of the present application and the contents of this patent is incorporated herein by reference.

An important point to be made regarding the present invention is that relatively minor subtle composition variations have marked affects on properties. These affects will be shown with reference to Table I which lists several closely related alloy compositions and Tables II and III which illustrate the creep properties and oxidation and sulfidation of these alloys.

TABLE 1

| Alloy | Alloy Compositions | | | | | | | | |
|---|---|---|---|---|---|---|---|---|---|
| | Cr | Ti | Mo | W | Re | Ta | Al | V | Ni |
| 203E | 5.0 | 1.1 | 2.0 | 5.0 | 3.0 | 6.5 | 5.5 | 0.4 | Bal. |
| 201E | 5.0 | 2.25 | 2.0 | 5.0 | 3.0 | 6.5 | 4.75 | — | Bal. |
| 202E | 5.0 | 1.5 | 2.0 | 5.0 | 3.0 | 6.5 | 5.5 | — | Bal. |
| 204E | 5.0 | 0.7 | 2.0 | 5.0 | 3.0 | 6.5 | 5.5 | 0.8 | Bal. |
| 205E | 5.0 | 1.1 | 2.0 | 8.0 | — | 6.5 | 5.5 | 0.4 | Bal. |

With regard to the compositions listed in Table I, the elements Al, Ti, Ta and V are the so-called gamma prime formers. These elements will be found almost entirely in the gamma prime strengthening phase, and the amount of these elements will have a controlled effect on the quantity of the gamma prime strengthening phase present. The elements Mo, W and Re strengthen the matrix gamma phase by a solid solution mechanism.

Referring now to Table I, it can be seen that the Cr levels, the Mo levels and the Ta levels for all the alloys are constant. Further, the Re levels are constant except for Alloy 205 and the Al levels are constant except for Alloy 201.

Alloy 203 is the alloy of the invention. Alloy 201 differs from Alloy 203 in having a reduced aluminum content and no vanadium. The titanium level of Alloy 201 was increased so as to provide an essentially constant quantity of the gamma prime forming elements relative to Alloy 203. It will subsequently be seen that Alloy 201 has substantially reduced oxidation resistance as a consequence of the reduced aluminum content.

Alloys 202 and 204, taken with Alloy 203, demonstrate the effect of vanadium. Alloy 202 has no vanadium, and the titanium level was increased so as to provide a constant amount of gamma prime forming elements. Alloy 203 contained 0.4% vanadium. Alloy 204 contained 0.8% vanadium and the titanium levels was decreased so that the amount of the gamma prime forming elements was constant. It will be seen that 0.0% V and 0.8% V both result in lower creep strengths than 0.4% V of Alloy 203.

Alloy 205 demonstrates the affect of rhenium on the creep strength. In Alloy 205, the rhenium was omitted while the tungsten level was increased so as to maintain a constant quantity of the gamma phase solid solution strengtheners. It will subsequently be seen that this substitution has a detrimental affect on creep strength. The effect of these relatively minor compositional changes on mechanical properties can be seen in Table II.

TABLE II

| Alloy | Creep Properties | | |
|---|---|---|---|
| | Test Conditions | 1% Creep (Hrs.) | Rupture Life (Hrs.) |
| 203E | 1800° F. 36 ksi | 91 | 264 |
| 201E | " | 71 | 182 |
| 202E | " | 77 | 180 |
| 204E | " | 69 | 172 |
| 205E | " | 20 | 89 |

Table II shows the creep properties, time to 1% creep and rupture life, at 1800° F. and an applied load of 36 ksi. A review of Table II shows that the rupture life of Alloy 203 is substantially greater than any of the other alloys shown in Table I. Alloys of the present invention, processed according to the present invention will have 1% creep lives in excess of 85 hours when tested at 1800° F./36 ksi. The time to 1% creep of Alloy 203 is also significantly greater than the time to 1% creep of the other alloys tested. While variations always occur in creep tests, the substantial superiority of Alloy 203 to the other alloys is believed to be very significant.

This table shows that relatively minor compositional changes have substantial effects on mechanical properties at elevated temperatures. These results support the criticality of the specific composition ranges which are claimed in this application.

TABLE III

| Alloy | 1650° F. Isothermal Sulfidation Resistance (Hrs/Mil of Attack-400 Hrs) | 2050° F. Cyclic Uncoated Oxidation Resistance (Mils of Attack After 200 Hrs) | 2150° F. Cyclic NiCoCrAlY Coated Oxidation Resistance (Hours/Mil Coating) |
|---|---|---|---|
| 203E | 17.8 | 14.0 | 233 |
| 201E | 16.1 | 26.5 | 80.2 |
| 202E | 16.7 | 12.0 | 80.2 |
| 204E | 19.9 | 17.0 | 203 |
| 205E | 20.0 | 15.5 | 218 |

Table III shows the properties of the alloys of Table I under test conditions which produce sulfidation (hot corrosion) and oxidation. The oxidation performance is shown both for the bare alloy and for the alloy coated with a state of the art overlay coating.

The sulfidation resistance of Alloy 203 is seen to be substantially equivalent to that of the other alloys tested within the normally encountered scatter in this type of test. The uncoated oxidation resistance of Alloy 203 is seen to be better than that of the alloys tested except for Alloy 202.

In modern gas turbine engines, superalloy articles are invariably given a protective coating. One of the most useful of these protective coatings is a NICoCrAlY coating having a nominal composition of 18% Cr, 23% Co, 12.5% Al, 0.3% Y, balance essentially nickel. This coating is described in U.S. Pat. No. 3,928,026 which is incorporated herein by reference. The coating is routinely applied by a vapor deposition process. The number given in Table III is for the hours of exposure time required for oxidation to penetrate the coating, divided by the coating thickness. This test gives a useful indication of the probable behavior of the alloy with the protective coating. In this test, Alloy 203 is seen to be at least as good as any of the other alloys and substantially better than Alloys 201 and 202.

Thus, it can be seen that Alloy 203 has an overall combination of properties superior to the properties of the other similar alloys in Table I. Alloy 203 demonstrates the best creep properties. With respect to sulfidation and oxidation resistance, Alloy 203 is competitive to the other alloys tested and displays a marked superiority in coated oxidation resistance to some of the other alloys. The information presented in Tables I, II and III shows how minor compositional changes can have distinct effects on alloy performance.

Table IV presents a comparison of creep properties of Alloy 203 with two other alloys.

TABLE IV

| | Comparison of Creep Properties | | |
|---|---|---|---|
| Alloy | Test Condition | Time to 1% Creep (Hrs) | Rupture Life (Hrs) |
| 203E | 1800° F./36 ksi | 91 | 264 |
| 454 | " | 38 | 100 |
| 1422 | " | 11 | 45 |
| 203E | 1600° F./70 ksi | 170 | 389 |
| 454 | " | 46.5 | 161 |
| 1422 | " | 10.5 | 55 |

Alloy 454 is described and claimed in pending application, U.S. Ser. No. 970,710. Alloy 454 is a single crystal alloy and the properties shown are for single crystal samples. The nominal composition of Alloy 454 is 10% Cr, 5% Co, 12% Ta, 4% W, 5% Al, 1.5% Ti, balance nickel.

Alloy 1422 is a commercially used nickel base superalloy having a nominal composition of 9% Cr, 10% Co, 12% W, 1% Cb, 2% Ti, 5% Al, 2% Hf, 0.15% C, 0.015% B, balance nickel. This alloy is used in columnar grain form as described in U.S. Pat. No. 3,494,709 and the properties shown in the tables are for samples of this type. Thus, Alloy 1422 is a state of the art columnar grain alloy and Alloy 454 is an advanced single crystal alloy.

Table IV shows that under test conditions of 1800° F. and a 36 ksi applied load Alloy 203 displays more than twice the performance of Alloy 454 and more than 8 times the life of Alloy 1422 in terms of time to 1% creep.

In terms of rupture life, Alloy has more than twice the life of Alloy 454 and more than 5 times the life of Alloy 1422. Under a lower temperature test condition, 1600° F. and 70 ksi applied load, similar results are observed with the superiority of Alloy 203 being, generally, greater than the superiority observed under the higher temperature test conditions.

TABLE V

| | Sulfidation And Oxidation Data Comparison | | |
|---|---|---|---|
| Alloy | 1650° F. Furnace Sulfidation (Mils of Attack after 400 hrs) | 2050° F. Uncoated Oxidation Resistance (Mils of Attack after 308 hrs) | 2150° F. NiCoCrAlY Coated Oxidation Resistance (hrs/Mil Coating) |
| 203E | 22.5 | 14.0 | 233 |
| 454 | 17.5 | 11.0 | 160 |
| 1422 | 26.1 | 38.5 | 50.5 |

Table V shows a comparison of these three alloys under test conditions producing sulfidation (hot corrosion) and oxidation. It can be seen that in terms of sulfidation resistance, Alloy 203 is slightly inferior to Alloy 454, although the difference between the alloys is not substantial in view of the general variability of this type of test. Alloy 203 is observed to be slightly better than Alloy 1422. Similar results are observed with respect to uncoated oxidation although Alloy 203 is substantially superior to Alloy 1422.

In the coated oxidation test in which the samples were coated with the previously described NiCoCrAlY overlay coating, the performance of Alloy 203 is significantly better than the performance of the other two alloys and is more than 4 times better than the performance of the commercially used Alloy 1422.

Thus, in terms of other superalloys, Alloy 203 is observed to have substantially improved creep properties in combination with sulfidation, oxidation and coated oxidation performance which is comparable to or superior to these other superalloys.

Alloy 203 derives its mechanical properties from a specific processing sequence similar in some respects to that described in U.S. Pat. No. 4,116,723 which is incorporated herein by reference.

The essentials of this sequence are that the alloy be produced in single crystal form, as previously described, solution treated so as to dissolve all of the gamma prime phase, rapidly cooled and then reheated to a temperature which will produce reprecipation of this gamma prime phase on a fine scale.

Alloy 203 has a gamma prime solvus temperature of about 2445° F. and an incipient melting temperature of about 2465° F. To dissolve the gamma prime phase, the alloy must be heated within the range of 2445° F. and 2465° F. for a period of time from about 1 to 10 hours.

The test results previously discussed were derived from samples which had been heated for 4 hours. The samples were then cooled at least as fast as the cooling rate produced by cooling in still air to a temperature such as 500° F. or below and then reheated to a temperature between about 1500° F. and 2100° F. for a period of time between about 2 and about 50 hours. The particular sequence used to produce the test results previously described was a 4 hour exposure at 1975° F. followed by a 32 hour exposure at 1600° F. As so heat treated, the article has a microstructure containing about 60-65 volume percent of the gamma prime phase in a gamma matrix. The average gamma prime particle size will be less than about 15 microns.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of my invention, that which I claim as new and desire to secure by Letters Patent of the United States is:

1. A heat treated single crystal superalloy article suited for use as an element in a gas turbine engine which consists of: 4.5 to 6% Cr, 5.0 to 5.8% Al, 0.8 to 1.5% Ti, 1.7 to 2.3% Mo, 4 to 6% W, 5.5 to 8% Ta, 1 to 5% Re, 0.2 to 0.6% V, 0 to 7% Co, balance essentially nickel, said article being free from internal grain boundaries and consisting of from about 60 to 65% of the gamma prime phase in a gamma matrix, with the average gamma prime particle size being less than about 0.5 micron, said article having a 1.0% creep life in excess of 80 hours and a rupture life in excess of 240 hours when tested at 1800° F. and a 36 KSI applied stress.

2. A method for producing a single crystal superalloy article, suited for use as an element in a gas turbine engine, which consists of:
a. providing a composition consisting essentially of 4.5 to 6% Cr, 5.0 to 5.8% Al, 0.8 to 1.5% Ti, 1.7 to 2.3% Mo, 4 to 6% W, 5.5 to 8% Ta, 1 to 5% Re, 0.2 to 0.6% V, 0 to 7% Co, balance essentially nickel;
b. melting and directionally solidifying the composition to produce a single crystal article;
c. heat treating the article between about 2445° and 2465° F. for from about 1 to 10 hours;
d. cooling the article;
e. reheating the article to at least one temperature between about 1500° and 2100° F. and holding the article within the temperature range of 1500° to 2100° F. for from about 2 to 50 hours.

* * * * *